United States Patent
Jiguet et al.

(10) Patent No.: US 6,897,694 B2
(45) Date of Patent: May 24, 2005

(54) CIRCUITRY FOR REDUCING THE SKEW BETWEEN TWO SIGNALS

(75) Inventors: Jean-Christophe Jiguet, Antibes (FR); Francesco Coppola, Antibes (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/643,068

(22) Filed: Aug. 18, 2003

(65) Prior Publication Data

US 2005/0040862 A1 Feb. 24, 2005

(30) Foreign Application Priority Data

Jan. 2, 2003 (EP) .............................................. 03290003

(51) Int. Cl.[7] .................................................. H03L 7/00
(52) U.S. Cl. ...................................... 327/161; 327/276
(58) Field of Search .............................. 327/3–12, 141, 327/154, 161, 261, 263, 276–277

(56) References Cited

U.S. PATENT DOCUMENTS

| 4,814,879 | A | | 3/1989 | McNeely |
| 5,880,612 | A | * | 3/1999 | Kim .............................. 327/158 |
| 6,192,092 | B1 | | 2/2001 | Dizon et al. |
| 6,469,550 | B1 | * | 10/2002 | Kurd ........................... 327/141 |
| 2002/0191719 | A1 | | 12/2002 | Hasako et al. |

FOREIGN PATENT DOCUMENTS

| DE | 199 20 335 C1 | 9/2000 |
| EP | 0 831 588 A2 | 3/1989 |
| FR | 2 768 575 | 3/1999 |

* cited by examiner

*Primary Examiner*—Timothy P. Callahan
*Assistant Examiner*—Cassandra Cox
(74) *Attorney, Agent, or Firm*—Ronald O. Neerings; Wade James Brady, III; Frederick J. Telecky, Jr.

(57) ABSTRACT

An electronic integrated circuit includes a first signal (A1) generated by a first source block (10) and a second signal (B1) generated by a second source block (12). A variable delay circuit (18) detects a delay between said first and second signals in calibration mode and applies the delay to the first signal during normal operation of the circuit. A fixed delay buffer (32) may be used to apply a delay to the second signal to compensate for known delays associated with the variable delay circuit (18).

10 Claims, 3 Drawing Sheets

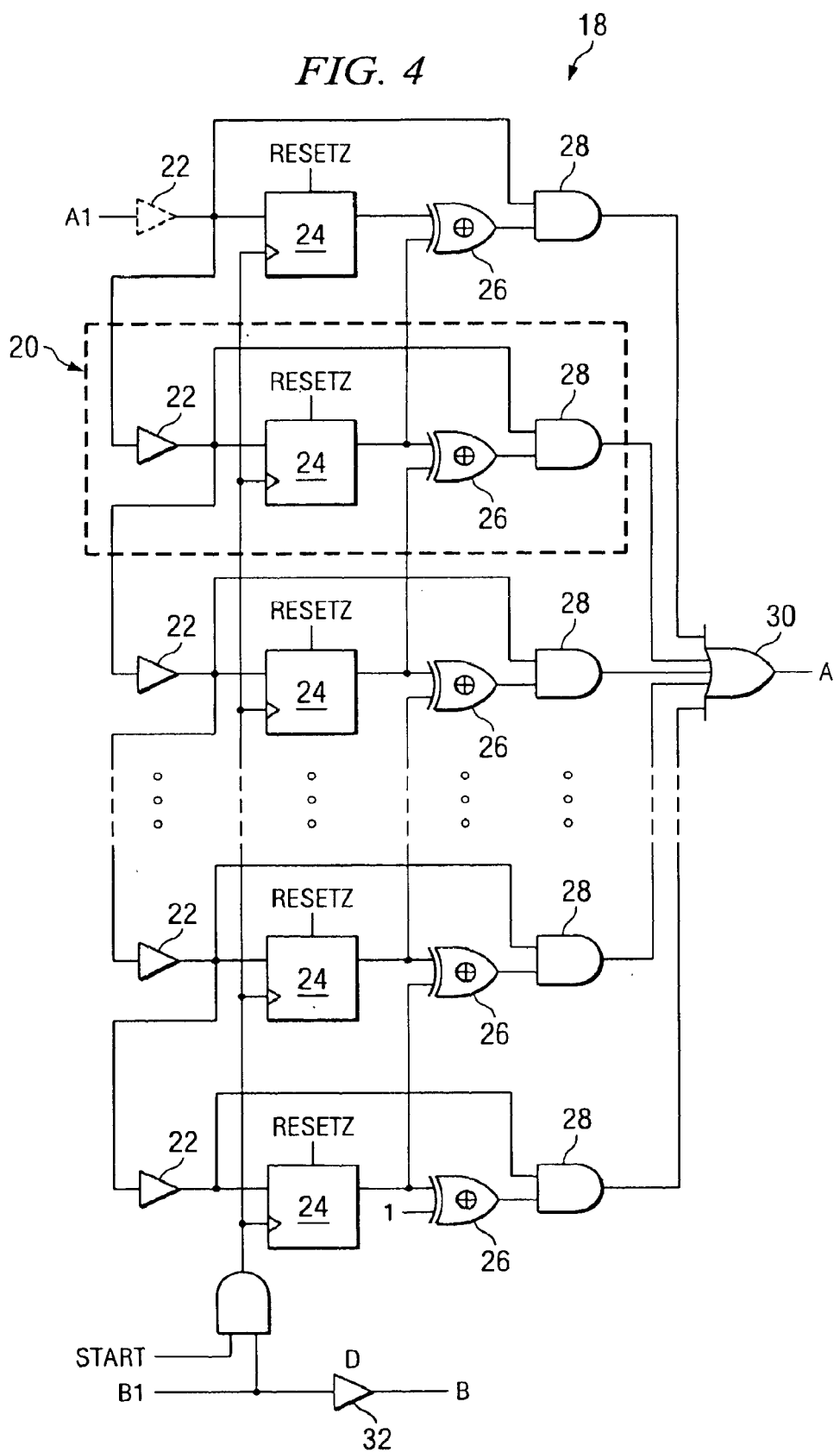

CIRCUITRY FOR REDUCING THE SKEW BETWEEN TWO SIGNALS

This application claims priority under 35 USC § 119(e)(1) of European Patent Application Number 03290003.7 filed Jan. 2, 2003.

CROSS REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to electronic circuits and, more particularly, to circuitry for reducing the skew between two signals.

2. Description of the Related Art

In the design of electronic circuits, it is often necessary to compensate for skew between two signals arriving at a common block. Traditionally, the skew between the two signals is reduced with the addition of buffers to equalize the difference between the paths of the two signals. Often, the appropriate buffers can be determined automatically using computer aided design tools.

An example of the problem is set forth in connection with FIGS. 1a and 1b. FIG. 1a illustrates an example a portion of an integrated circuit where signals from two different circuitry blocks (source blocks) are received at a third block (user block). First source block 10 is clocked using clock Ca and a second circuitry block 12 is clocked using clock Cb. First and second source blocks 10 and 12 could implement any type of analog or digital circuitry, or a mix thereof. As shown in FIG. 1b, Clocks Ca and Cb are skewed by an amount Skew(Ca−Cb). The output A of source block 10 is delayed by a time Da due to propagation through the logic of source block 10 and routing delays between the output of source block 10 and the input to user block 14. Similarly, the output B of source block 12 is delayed by a time Db due to propagation through the logic of source block 12 and routing delays between the output of source block 12 and the input to user block 14. For reference, FIG. 1b is a timing diagram which shows the skew between clocks Ca and Cb at the inputs to source blocks 10 and 12, respectively, and shows the delay between the resulting signals at the input to user block 14. This delay is a factor of the skew between clocks Ca and Cb and the delays Da and Db. The delay between signals A and B at the input to user block 14 could be defined as:

$$\text{Delay}(A-B) = \text{Skew}(Ca-Cb) + Db - Da$$

In mixed signal design, there will be digital spread delays and analog spread delays. The spread of each cannot be easily compensated with a unique addition of digital delay.

Therefore a need has arisen for a method and circuit for reducing skew between two signals.

BRIEF SUMMARY OF THE INVENTION

In the present invention an electronic circuit includes a first source circuit for generating a first signal and for generating a first calibration signal responsive to a calibration mode and a second source circuit of generating a second signal and for generating a second calibration signal responsive to the calibration mode. A variable delay circuit detects a delay between the first and second calibration signals and applies a delay to the first signal responsive to the detected delay.

The present invention provides significant advantages over the prior art. The variable delay circuit can provide high precision compensation for delays between two signals as determined at the input to a circuit that uses the two signals. Therefore, the variable delay circuit takes into account all sources of delay, without needing any knowledge of the sources of delay or their possible variations. Since calibration can occur as often as desired, the variable delay circuit can compensate for dynamically varying delays. The variable delay circuit is particularly well suited for use with analog RF designs which need frequent high precision calibration between signals.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 1b is a timing diagram for the circuit of FIG. 1a;

FIG. 2b is a timing diagram for the prior art solution of FIG. 2a;

FIG. 3b is a timing diagram for the circuit of FIG. 3a; and

FIG. 4 is a schematic diagram of a preferred embodiment for a variable delay circuit.

DETAILED DESCRIPTION OF THE INVENTION

The present invention is best understood in relation to FIGS. 1–4 of the drawings, like numerals being used for like elements of the various drawings.

Figure 1A:
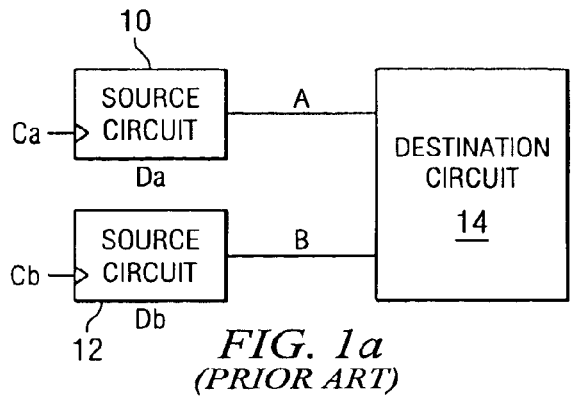
FIG. 1a is a block diagram of an circuit illustrating the problem of skewed signals.
Figure 1B:
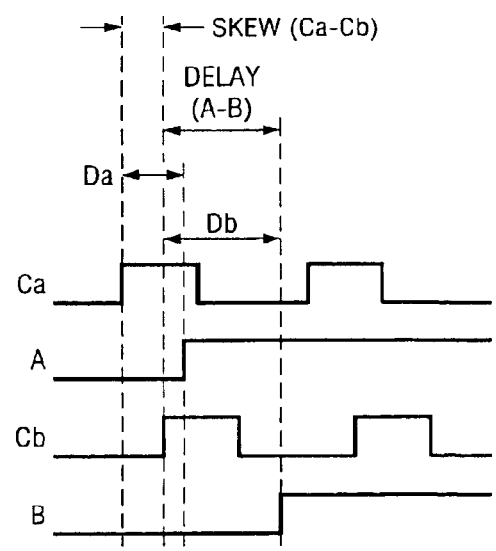
Figure 2A:
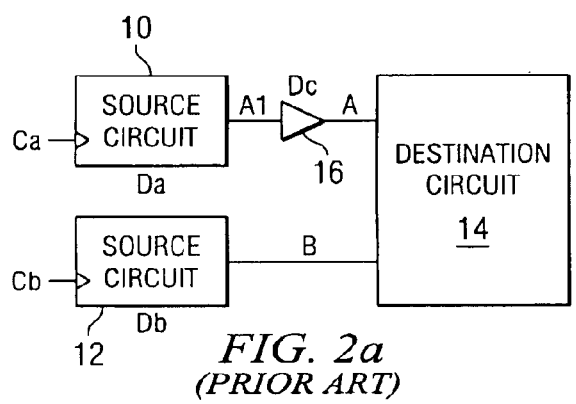
FIG. 2a is a block diagram of a prior art solution for skewed signals.
Figure 2B:
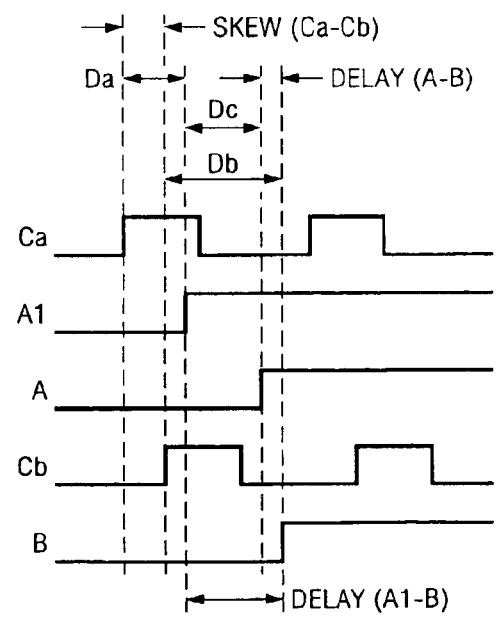

FIGS. 2a and 2b illustrate a prior art solution to the problem of signal skew. FIG. 2a is the same as the example circuit of FIG. 1a, with the addition of a delay buffer 16 between the output (A1) of source circuitry 10 and the input (A) to user circuitry 14. The delay Dc is calculated to compensate for the delays caused by clock skew and logic and routing delays. With the addition of delay buffer 16, the delay between signals A and B could be estimated as:

$$\text{Delay}(A-B) = \text{Skew}(Ca-Cb) + Db - (Da+Dc)$$

However, it should be noted that clock and signal delays are not exact, since each has a spread which may very based on processing variations and environmental factors. Some environmental factors, such as temperature, may vary during operation of a device. Hence $Ca = Ca_{nom} \pm \Delta_{Ca}$, $Cb = Cb_{nom} \pm \Delta_{Cb}$, $Da = Da_{nom} \pm \Delta_{Da}$, $Db = Db_{nom} \pm \Delta_{Db}$, and $Dc = Dc_{nom} \pm \Delta_{Dc}$, where "nom" indicates and expected nominal value and $\Delta$ indicates an expected variation.

In many cases, the possible variations in the delays and clock skew, along with the variation on the compensation delay, Dc, make it impossible to guarantee that the delay between the A and B signals will be within maximum design specifications.

Figure 3A:
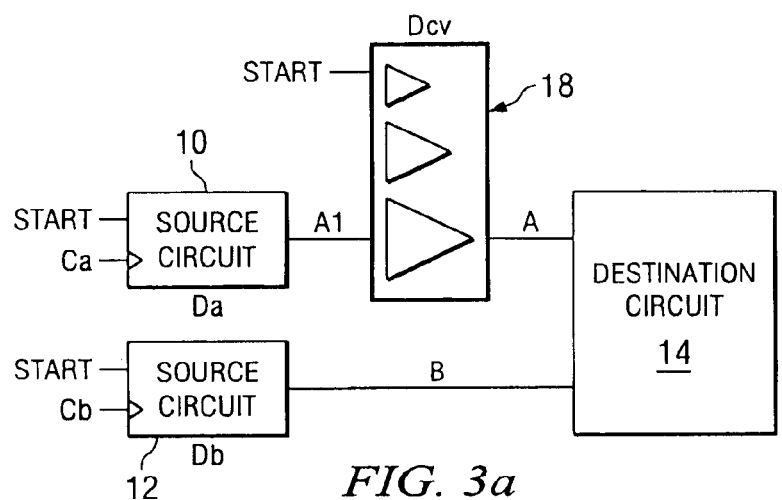
FIG. 3a is a block diagram of a circuit with a variable delay circuit to minimize delays between signals.
Figure 3B:
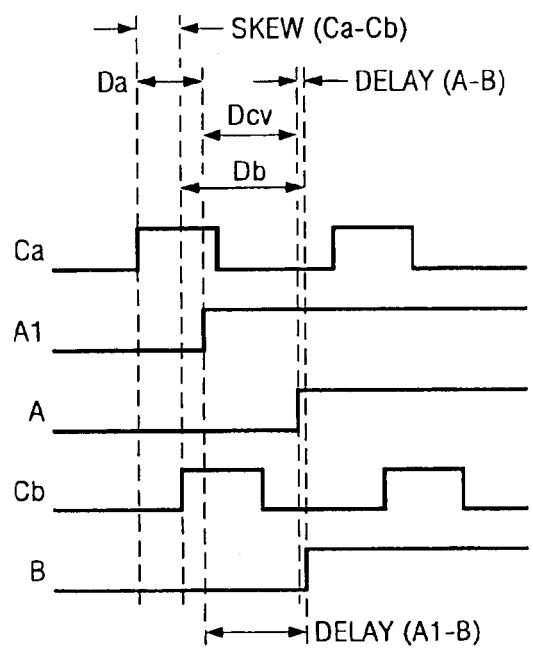

FIGS. 3a and 3b illustrate a circuit using dynamic best fit delay compensation. In FIG. 3a, the delay buffer 16, with fixed delay Dc, has been replaced with a variable delay buffer 18, with a dynamically variable delay component Dcv.

During operation of the device, a Start signal is used to calibrate the variable delay circuit 18, such that Dcv is set to an appropriate value that will compensate for the clock skew and delays Da and Db. Dcv is set until a reset signal initiates another calibration. Depending upon the design, the circuit could be calibrated upon start-up, periodically, upon an event, or upon each use of the user circuitry block 14.

FIG. 4 illustrates a preferred embodiment of a variable delay buffer 18. The variable delay buffer 18 comprises a plurality of delay stages 20. A delay stage includes a fixed delay buffer 22, a flip-flop 24, an exclusive-or gate 26 and an AND gate 28. Each fixed delay buffer 22 receives the output of the fixed delay buffer of the preceding stage 20. The first stage receives the output (A1) of the first source block 10 and can optionally have a delay buffer 22 or have no delay (as shown). The output of the fixed delay buffer 22 is coupled to the input of a flip-flop 24. Flip-flop 24 is clocked by the output (B1) of the second source block 12 while the Start signal is active (in the illustrated embodiment, the Start signal is active high). The flip-flops 24 are reset by signal RESETZ (active low). The output of flip-flop 24 is coupled to the input of exclusive-or gate 26. The other input of exclusive-or gate 26 is coupled to the output of the flip-flop of the subsequent stage 20. For the last stage 20, the second input to the exclusive-or gate is tied to a logical "1". The output of exclusive-or gate 26 is coupled to one input of an AND gate 28. The other input to the AND gate is the output of the fixed buffer 22 of the same stage 20. The outputs of the AND gates of all stages are coupled to the inputs of OR gate 30. The output of the OR gate 30 is the input (A) to the user block 14.

The output (B1) of the second source block 12 is coupled to fixed delay buffer 32, with a delay D0. The output of fixed delay buffer 32 is the input to the user block 14.

In operation, the Start signal begins a calibration cycle. It is assumed that the B1 signal is known to (or is designed to) transition to an active state after the A1 signal. Prior to calibration, all flip-flops 24 are reset to output logical "0"s by the RESETZ signal. When the B1 signal transitions high (active), the A1 signal will have begun propagation through the fixed delay buffers 22. When the flip-flops are set, there will be a single occurrence where flip-flops from two consecutive stages have outputs of different logical values—the earlier stage will output a logical "1" and the later stage will output a logical "0". This is the point where the active edge has propagated through the delay buffers 22.

The AND gate 28 of the stage 20 having the exclusive-or gate 26 with a "1" output will pass the output of that stage's fixed delay buffer 22. Hence, the exclusive-gates 26 and the AND gates 28 form a multiplexer which selects the output of a fixed delay buffer 22 whose cumulative delay (i.e., the delay of all buffers in the chain) most closely matches the delay between the A1 and B1 outputs. In the illustrated embodiment, the exclusive-or gates 26 are configured to choose the output of the fixed delay buffer 22 in the earlier of the two stages at which the transition occurs as the best fit delay; alternatively, the output of the fixed delay buffer 22 in the later of the two stages could be chosen as the best fit delay by coupling each exclusive-or gate to the output of the flip-flop 24 of its own stage and the output of the flip-flop 24 of the preceding stage (rather than the output of the flip-flop 24 of the subsequent stage, as shown).

Table 1 illustrates the propagation of the A1 signal through the variable delay buffer 18 during a calibration cycle. When B1 transitions to an active state, A1 has passed through the delay buffers 22 of stages 1–4, but has not yet passed through the delay buffer 22 of stage 5. If the delay of each delay buffer 22 is D, it can be said that 4*D<=Delay (A1−B1)<5*D.

TABLE 1

EXAMPLE OF VARIABLE DELAY BUFFER

| Stage | Output of buffer 22 | Output of flip-flop 24 | Output of XOR gate 26 | Output of AND gate 28 |
|---|---|---|---|---|
| 1 | 1 | 1 | 0 | 0 |
| 2 | 1 | 1 | 0 | 0 |
| 3 | 1 | 1 | 0 | 0 |
| 4 | 1 | 1 | 1 | Output of buffer 22 of stage 4 |
| 5 | 0 | 0 | 0 | 0 |
| 6 | 0 | 0 | 0 | 0 |
| 7 | 0 | 0 | 0 | 0 |

The exclusive-or gate 26 for stage "4" will be the only exclusive-or gate that outputs a "1"; the remainder of the exclusive-or gates 26 will output "0"s. Accordingly, only the AND gate 28 of stage "4" will pass the output of the stage's fixed delay buffer 22. The outputs of all other AND gates 28 will be logical "0"s.

The maximum delay is provided at the output of the fixed delay buffer 22 of the last stage. If the active edge of A1 precedes the active edge of B1 by more the sum of all the fixed delay buffers 22, then the maximum delay will be used (since the input of the exclusive-or gate 26 in the last stage is set to a "1").

The implementation of the variable delay circuit 18 shown in FIG. 4 is designed to minimize the delay between the A1 and B1 signals without exceeding the actual delay between the signals. Alternatively, by coupling one input of the exclusive-or gates 26 to the output of the preceding flip-flop 24, rather than the subsequent flip-flop 24, the delay provided by the variable delay circuit 18 would be the minimum delay needed to close or exceed the actual delay between the A1 and B1 signals.

For a given maximum delay, the resolution of the variable delay circuit 18 can be increased by providing more delay elements 22, each with a smaller delay D.

After the appropriate delay buffer 22 is selected for output, the Start signal transitions to an inactive state. At this point, the appropriate delay is memorized in the variable delay circuit 18. The A1 signal will continue to pass through the chain of delay buffers 22 up to the selected delay buffer, at which point it will pass through the AND gate 28 of the associated stage and the OR gate 30 to the user block 14. This will continue until another calibration is initiated using the Start signal.

The delay buffer 32 compensates for the delays associated with the AND gate 28 and OR gate 30 through which the A1 signal must pass. However, since these delay buffer 32 is fabricated in close proximity to the AND gates 28 and OR gates 30, any variation due to processing or temperature will be closely matched.

The present invention provides significant advantages over the prior art. The variable delay circuit 18 provides high precision compensation for delays between two signals. The compensation is determined at the input to the user circuit 14 and therefore takes into account all sources of delay, without needing any knowledge of the sources of delay or their possible variations. Since calibration can occur as often as desired, the variable delay circuit 18 can compensate of dynamically varying delays. The variable delay circuit is particularly well suited for use with analog RF designs which need frequent high precision calibration between signals.

As is known to those skilled in the art, the logic used to implement the multiplexer could be varied, without changing the functionality of the variable delay circuit 18. The concept is easily extended to cases where the active edges of A1, B1 and Start could be logical "0"s or mixed.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope the claims.

What is claimed is:

1. An electronic circuit comprising:

a first source circuit for generating a first signal and for generating a first calibration signal responsive to a calibration mode;

a second source circuit of generating a second signal and for generating a second calibration signal responsive to the calibration mode;

a variable delay circuit for detecting a delay between said first and second calibration signals and applying a delay to said first signal responsive to the detected delay prior to passing said first signal to a third circuit receiving both the first signal and the second signal, such that the variable delay circuit accounts for all relative delays between said first and second source circuits.

2. The electronic circuit of claim 1 and further comprising a fixed delay buffer for applying a fixed delay to said second signal to compensate for delays attributable to said variable delay circuit.

3. The electronic circuit of claim 1 wherein said variable delay circuit comprises a chain of fixed delay buffers and circuitry for selecting an output of one of said fixed delay buffers responsive to the detected delay.

4. The electronic circuit of claim 3 wherein said selecting circuitry comprises circuitry for detecting a transition of said first calibration signal in said chain of fixed delay buffers responsive to an active transition of said second calibration signal.

5. The electronic circuit of claim 4 wherein said circuitry for detecting a transition comprises a plurality of flip-flops for storing outputs of respective fixed delay buffers responsive to said active transition of said second calibration signal.

6. An method of reducing skew between a first signal from a first source circuit and a second signal from a second source circuit, comprising the steps of:

generating a first calibration signal at the first source circuit responsive to a calibration mode;

generating a second calibration signal at the second source circuit responsive to the calibration mode;

detecting a best fit delay between said first and second calibration signals, such that the best fit delay accounts for all relative delays between said first and second source circuits; and passing said first signal to a third circuit after applying the best fit delay to said first signal.

7. The method of claim 6 and further comprising the step of applying a fixed delay to said second signal to compensate for delays attributable to said passing step and passing the second signal to a third circuit after applying the fixed delay.

8. The method of claim 6 wherein said detecting step comprises the steps of:

propagating the first calibration signal through a chain of fixed delay buffers; and detecting a transition of the first calibration signal between adjacent fixed delay buffers.

9. The method of claim 8 wherein said detecting step further comprises the step of storing outputs of the fixed delay buffers in respective flip-flops.

10. The method of claim 8 wherein said passing step comprises the step of passing the output of one of said adjacent fixed delay buffers.

* * * * *